United States Patent
Pokharna et al.

(10) Patent No.: US 7,060,234 B2
(45) Date of Patent: Jun. 13, 2006

(54) PROCESS AND APPARATUS FOR ABATEMENT OF BY PRODUCTS GENERATED FROM DEPOSITION PROCESSES AND CLEANING OF DEPOSITION CHAMBERS

(75) Inventors: Himanshu Pokharna, San Jose, CA (US); Phong Le, Sunnyvale, CA (US); Srinivas D. Nemani, San Jose, CA (US)

(73) Assignee: Applied Materials, Santa Clara, CA (US)

( * ) Notice: Subject to any disclaimer, the term of this patent is extended or adjusted under 35 U.S.C. 154(b) by 577 days.

(21) Appl. No.: 09/908,668

(22) Filed: Jul. 18, 2001

(65) Prior Publication Data

US 2003/0017087 A1    Jan. 23, 2003

(51) Int. Cl.
*A62D 3/00* (2006.01)
(52) U.S. Cl. .................................................. 423/240 R
(58) Field of Classification Search ............ 423/240 R, 423/241; 588/248
See application file for complete search history.

(56) References Cited

U.S. PATENT DOCUMENTS

| 5,129,958 | A | * | 7/1992 | Nagashima et al. ....... 134/22.1 |
| 5,632,821 | A | * | 5/1997 | Doi ............................. 134/1.1 |
| 5,759,237 | A |   | 6/1998 | Li et al. |
| 5,851,293 | A |   | 12/1998 | Lane et al. |
| 5,900,288 | A | * | 5/1999 | Kuhman et al. ............. 427/534 |
| 5,955,037 | A |   | 9/1999 | Holst et al. |
| 6,060,397 | A |   | 5/2000 | Seamons et al. |
| 6,089,472 | A |   | 7/2000 | Carter |
| 6,099,649 | A |   | 8/2000 | Schmitt et al. |
| 6,106,790 | A |   | 8/2000 | Hsiung et al. |
| 6,109,206 | A |   | 8/2000 | Maydan et al. |
| 6,187,072 | B1 |   | 2/2001 | Cheung et al. |
| 6,350,697 | B1 | * | 2/2002 | Richardson et al. ........ 438/710 |
| 6,468,490 | B1 | * | 10/2002 | Shamouilian et al. ....... 423/241 |

OTHER PUBLICATIONS

ICONEL® 601, http/www.c276.com/DataSheets/601.htm, Oct. 2, 2000.

* cited by examiner

*Primary Examiner*—Edward M. Johnson
(74) *Attorney, Agent, or Firm*—Townsend Townsend Crew, LLP

(57) ABSTRACT

Method and apparatus for abating $F_2$ from byproducts generated during cleaning of a processing chamber. $F_2$ abatement is efficiently performed by directly injecting $H_2$ in line with a foreline exiting the processing chamber. A tube which is highly resistant to oxidation and corrosive gases, even at high temperature, is connected in line with the foreline as part of the exhaust line of the processing chamber. A cooling jacket may be provided for cooling the tube, since the reaction between $F_2$ and $H_2$ is exothermic. A pressure monitoring arrangement may also be employed to insure that pressure within a hydrogen line, that feeds the injection of $H_2$ into the tube, does not exceed a predetermined pressure value.

21 Claims, 3 Drawing Sheets

PROCESS AND APPARATUS FOR ABATEMENT OF BY PRODUCTS GENERATED FROM DEPOSITION PROCESSES AND CLEANING OF DEPOSITION CHAMBERS

FIELD OF THE INVENTION

The present invention relates to apparatus and processes used for abatement of by-products generated when cleaning depositions left in a chamber used to deposit layers of material in semiconductor manufacturing processes.

BACKGROUND OF THE INVENTION

During a typical CVD (i.e., chemical vapor deposition) process, deposition gas or gases inside a processing chamber form a thin film layer on the surface of a substrate being processed. Some CVD processes react two or more gases together to form the desired layer. For example, an oxygen source gas may be mixed with a silane source gas to form a type of silicon dioxide layer. Organosilanes also may be used as precursor gases, and are oxidized to form organosilicon oxides. During the deposition of a layer, not only does the substrate become covered with the material forming the layer, but other exposed surfaces within the chamber receive deposits as well. With repetition of the deposition process, the CVD chamber eventually will need to be cleaned because of the accumulation of deposits from each deposition process. Left uncleaned, at some point these deposits can crack and fall or flake off, with a possibility of contaminating the substrate that happens to be in the chamber for processing at the time.

As a result, CVD chambers must be periodically cleaned to remove deposits which accumulated within the chamber with each deposition process. A typical method of cleaning involves the introduction of cleaning gases into the chamber to react with the deposited material to form a product or products that can be exhausted from the chamber. U.S. Pat. No. 6,060,397 discloses examples of such cleaning processes, for example. Typically, a cleaning gas such as a fluorinated gas is introduced into the chamber and a plasma (using RF, or microwave energy, for example) is struck in the chamber. The resultant excited products react with the deposition materials to form gaseous byproducts which are then exhausted from the chamber.

Unfortunately, many of these byproducts are hazardous air pollutants, which pose a strong environmental concern as they may negatively effect such problems as global warming, ozone deterioration, etc. Consequently, various abatement procedures have been developed in an effort to minimize or eliminate the hazardous air pollutants before they can be released to the atmosphere.

The most common tool designs use an incinerator, such as a Guardian 4 (available from Boc Edwards, Santa Clara, Calif.), which treats flammable and oxidizing gases and allows corrosive gases to pass through to be treated by a scrubbed exhaust system. Although this system is widely used and has a relatively small footprint, it is susceptible to heavy use of corrosive gases which may significantly shorten its life span, and more than one unit may be needed to adequately abate cleaning byproducts from a chamber capable of processing 300 mm wafers. More importantly, this system does not remove hazardous air pollutants, such as $F_2$ from the exhaust gases.

Another tool, known as an adsorption or dry scrubber uses resin bottles in cabinets that collect the exhausted byproducts and chemically convert the gases to solid byproducts which then remain in the bottles. However, hydrogen is not treated by this tool and therefor an incinerator is still needed for treating hydrogen. The life span of the bottles is also short, sometimes as short as twenty days. Disposal fees for the spent bottles are also high. Some applications require two of these scrubbers, one for $NF_3$ and one for flammable gases.

Another tool, known as a CDO (Controlled Decomposition/Oxidation Unit), such as the Delatech 857, Delatech 858 or Delatech 880, for example, uses a two stage process in which the exhaust is first oxidized at high temperatures and then scrubbed with water to remove particulates and mineral acids. This type of system requires a wastewater stream of about two gallons per minute, the drainage of which can be problematic, and the system itself is also very expensive and requires an additional space on the processing floor, due to its footprint.

Thus, there remains a need for a clean, efficient and relatively inexpensive abatement system for abatement of by-products generated when cleaning depositions left in a chamber used to deposit layers of material in semiconductor manufacturing processes. Since $F_2$ cannot be effectively incinerated or scrubbed, there is a particular need for an abatement apparatus that efficiently and cost effectively abates $F_2$. A reduction in footprint of such a device, as compared to abatement tools currently in use would also be welcomed.

SUMMARY OF THE INVENTION

The present invention provides a method of abating $F_2$ from byproducts generated during cleaning of a processing chamber, such as a CVD chamber, for example. $H_2$ is directly injected, in line with a foreline carrying the byproducts from the chamber, where the $H_2$ reacts with the $F_2$ present in the byproducts. The reaction converts $F_2$ to HF, which can be readily removed by conventional scrubbing.

The reaction is an exothermic reaction which heats up the line where the reaction takes place. Accordingly, the reaction site may be temperature controlled during abatement. For example, the temperature may be controlled within a range of about 200° C. to about 400° C.

Control of the temperature may be carried out by monitoring the temperature, and flowing a coolant over the line within which the reaction is occurring, at a rate to maintain the temperature within a predetermined temperature range.

The abatement process may also include monitoring a pressure of a line used for injecting the $H_2$ inline. With such monitoring, the process may be set up such that injection of $H_2$ is stopped when it is determined, through monitoring, that the pressure of the line used for injecting $H_2$ exceeds a predetermined pressure value.

The injection of $H_2$ is preferably performed at a flow rate determined to provide a stoichiometric amount of $H_2$ to react with the amount of $F_2$ byproduct present.

An apparatus for abating $F_2$ from byproducts generated during cleaning of a processing chamber is provided which includes a tube which is highly resistant to oxidation and corrosive gases up to a temperature of at least about 400° C., and is adapted for direct inline connection to a foreline exiting the chamber. The tube is provided with an inlet adapted to hermetically seal with a hydrogen line for injection of hydrogen into the tube.

The apparatus may further include a cooling jacket surrounding and thermally connected to the tube. The cooling jacket may be configured of a double walled cylindrical structure defining a passage between the walls for channeling a coolant therethrough.

An assembly for abating $F_2$ from byproducts generated during cleaning of a processing chamber according to the present invention includes a tube which is highly resistant to oxidation and corrosive gases up to a temperature of at least about 400° C. and is adapted for direct inline connection to a foreline exiting the chamber. A gas panel is provided for controlling a flow rate of $H_2$ exiting the gas panel to be injected into the tube. A gas line interconnects the gas panel and the tube and delivers $H_2$ to the tube for direct injection into the tube.

A cooling jacket may be provided to surround and thermally connect with the tube for temperature control of the tube during processing. A thermocouple may be thermally connected to at least one of the cooling jacket, foreline and tube, to provide feedback to a controller for maintaining a temperature of the tube during abatement processing.

Flow control means may be provided for changing a flow rate of coolant through the cooling jacket based upon a temperature reading received through feedback from the thermocouple.

A scrubber may also be connected downstream of the tube for scrubbing HF byproduct resulting from reacting the $F_2$ with the $H_2$.

A pressure gauge may be provided in line with the gas line for monitoring the pressure within the gas line the pressure gauge may be connected to the gas panel to provide the gas panel with a signal indicative of a pressure within the gas line. The gas panel may include a gas control means for shutting off a flow of $H_2$ through the gas line wherein the gas panel controls the gas control means to shut off the gas flow when the gas panel receives a signal from the pressure gauge that indicates that a predetermined pressure level has been exceeded.

These and other features of the invention will become apparent to those persons skilled in the art upon reading the details of the invention as more fully described below.

DETAILED DESCRIPTION OF PREFERRED EMBODIMENTS

Before the present processes are described, it is to be understood that this invention is not limited to particular processes described, as such may, of course, vary. It is also to be understood that the terminology used herein is for the purpose of describing particular embodiments only, and is not intended to be limiting, since the scope of the present invention will be limited only by the appended claims.

Where a range of values is provided, it is understood that each intervening value, to the tenth of the unit of the lower limit unless the context clearly dictates otherwise, between the upper and lower limits of that range is also specifically disclosed. Each smaller range between any stated value or intervening value in a stated range and any other stated or intervening value in that stated range is encompassed within the invention. The upper and lower limits of these smaller ranges may independently be included or excluded in the range, and each range where either, neither or both limits are included in the smaller ranges is also encompassed within the invention, subject to any specifically excluded limit in the stated range. Where the stated range includes one or both of the limits, ranges excluding either or both of those included limits are also included in the invention.

Unless defined otherwise, all technical and scientific terms used herein have the same meaning as commonly understood by one of ordinary skill in the art to which this invention belongs. Although any methods and materials similar or equivalent to those described herein can be used in the practice or testing of the present invention, the preferred methods and materials are now described.

It must be noted that as used herein and in the appended claims, the singular forms "a", "and", and "the" include plural referents unless the context clearly dictates otherwise. Thus, for example, reference to "a material" includes a plurality of such material and reference to "the device" includes reference to one or more devices and equivalents thereof known to those skilled in the art, and so forth.

The publications discussed herein are provided solely for their disclosure prior to the filing date of the present application. Nothing herein is to be construed as an admission that the present invention is not entitled to antedate such publication by virtue of prior invention. Further, the dates of publication provided may be different from the actual publication dates which may need to be independently confirmed.

Figure 1:
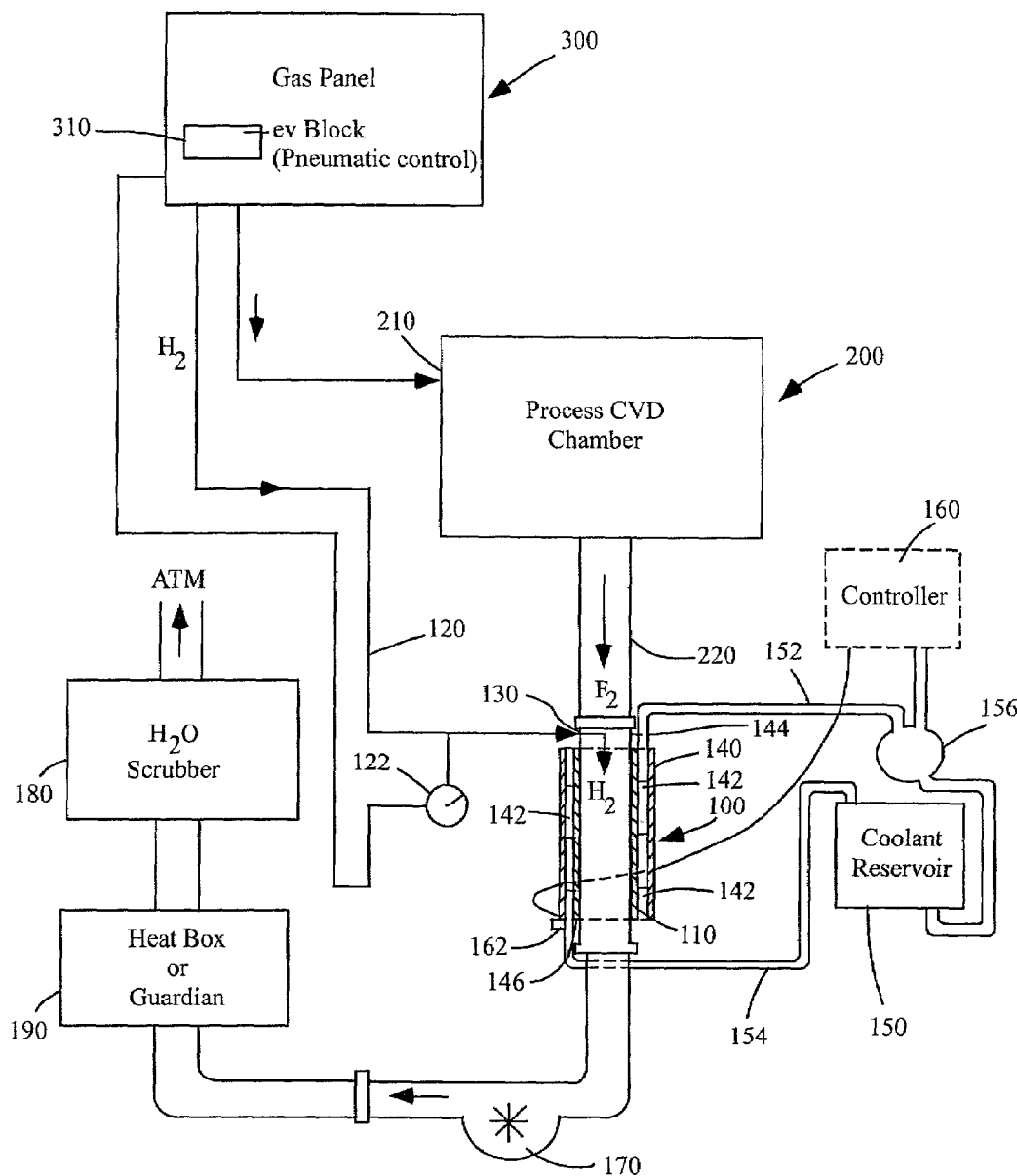
FIG. 1 is a schematic diagram of a CVD processor fitted with an abatement apparatus according to the present invention.

Referring to FIG. 1, a schematic diagram of a CVD processor fitted with an abatement apparatus according to the present invention is shown. Process chamber 200 many be any configuration used for the chemical vapor deposition of material layers on a substrate, and is generally a CVD chamber used in semiconductor processing, such as those used for the deposition of conducting layers, dielectric layers, etch stop layers and the like onto a substrate such as a semiconductor wafer, flat panel, or other substrate on which a semiconductor construct is built. It is noted here that the present invention is not limited to use only with CVD chambers, but can be employed in other chambers having oxide deposits, such as PVD chambers, RTP chambers and the like.

A gas panel 300, such as the P5000 Mainframe, Centura or Producer (all available from Applied Materials, Santa Clara, Calif.) is used to control the flow of cleaning gases into the process chamber 200, which are inputted through input line 210. The cleaning gases may comprise various different fluorinated gases as well as combinations of the same. In the example shown, $NF_3$ or $F_2$ is flowed into the process chamber for cleaning. The cleaning process may be conducted by a microwave or remote cleaning process and apparatus therefor (not shown), wherein microwave energy is applied to generate a plasma, as known in the art. Alternatively, a fluorinator (not shown) may be used to input $F_2$ to the chamber, as also known in the art, or other methods and apparatuses for cleaning which use fluorinated cleaning agents may be used, including those discussed in the background section above. The reactants or byproducts, which result from the cleaning process and the chemical reactions that occur between the contents of the deposits in the chamber 200 and the cleaning materials, are exhausted through the foreline 220 exiting from the chamber 200.

During the reaction between the cleaning gas or gases and the deposits in the chamber, various gaseous byproducts are generated, as indicated above, and these gases are then exhausted through foreline 220. The byproduct with which the present invention is concerned is fluorine ($F_2$), since this byproduct can be neither scrubbed with a water scrubber nor effectively incinerated with a heat box, such as a Guardian, in order to prevent its release to the atmosphere, and since its release to the atmosphere is extremely problematic, as noted above. As an example, in a situation where $SiO_2$ deposits are being cleaned from a CVD chamber using $NF_3$, the following chemical reactions take place during the cleaning phase to form $F_2$ among the resultant byproducts:

$$SiO_2 + 2\ NF_3 \rightarrow SiF_4 + 2NO + F_2$$

An effective method of abating $F_2$ as a byproduct, is to react $H_2$ with the $F_2$ to form HF, a byproduct which can be effectively abated by scrubbing with water. Although hydrogen gas is the preferred reagent for reaction with the $F_2$, other reducing gases having a strong $H^+$ content and which would not form hazardous byproducts with the $F_2$ could also be used. As an example, diluted hydrogen, such as 10% hydrogen and 90% nitrogen could be used, although this mixture is less desirable as potentially forming other nonhazardous deposits at the site and downstream of the reaction. Abatement apparatus 100 is provided to facilitate the direct injection of $H_2$ into the effluent that exits through the foreline 220, to permit a reaction between $H_2$ and $F_2$ inline, as shown in FIG. 1. In the example shown, abatement apparatus 100 includes a tube 110 which is connected inline, downstream of the chamber 200 in line as a continuation of foreline 220. Tube 110 should be made from a material which exhibits a high resistance oxidation and to corrosive gases, including $F_2$, even at elevated temperatures of at least up to 400° C., more preferably up to 1,200° C.

Because the injection of hydrogen is generally conducted substantially downstream of the chamber 200 and relatively close to pump 170, backstreaming of hydrogen into chamber 200 is not an issue. Additionally, $NF_3$, optionally diluted with He or Ar, is pumped through the chamber 200 at a flow rate of about 6 liters/min, while the flow rate of hydrogen inputted into foreline 110 is significantly lower than the flow rate exiting the chamber, also preventing backstreaming.

In the example shown, the tube 110 is formed of INCONEL7, a high performance iron alloy which also includes Ni, Cr, Cu, Al, Mn, Si, Ti and C, and is available from High Performance Alloys, Inc., Tipton, Ind., although other alloys, such as stainless steel could be used. The INCONEL7 tube exhibits good oxidation and corrosion resistance up to temperatures of about 1,250° C.

A line 120 for delivering $H_2$ to the effluent interconnects the gas panel 300 (into which a source of $H_2$ is fed) with tube 110. Line 120 must be joined to both the gas panel 300 and tube 110 in a very reliably leakproof manner due to the extremely explosive nature of $H_2$. For example, line 120 may be joined to tube 110 using a metal to metal fitting 130, such as a VCR fitting. In the example of FIG. 1, a ¼ inch VCR fitting is used to connect line 120 to tube 110.

The reaction of $H_2$ with $F_2$ is an exothermic reaction as follows:

$$H_{2(g)} + F_{2(g)} \rightarrow HF_{(g)};\ \text{where } \Delta H_f = -273\ \text{kJ/mol at STP};$$

wherein $\Delta H_f$ is the heat of formation; and

STP is standard temperature and pressure.

Because the reaction is exothermic, the reaction will take place at room temperature, and no additional plasma or input of energy is required. The fact that the reaction is exothermic is also significant in that the heat generation caused by the continuing reaction as the effluents and $H_2$ flow through the tube 110 cause a buildup of temperature which must be controlled. The temperature increase in an of itself would be a sufficient concern for controlling the temperature of the tube 110, but an even more compelling reason is that with an increase in temperature also comes an increase in pressure within the tube 110. This phenomenon, if not controlled, could quickly result in a dangerous situation, since if the pressure is allowed to exceed the safety limits of the connector 130, or any other location along the hydrogen line 120, a leak could result which could lead to a fire or an explosion. For these reasons, a cooling jacket 140 is provided which is thermally coupled by wrapping the jacket around the tube so as to substantially surround the tube 110.

In the example shown in FIG. 1, the cooling jacket 140 comprises a double-walled annular construction of a good thermal conducting material, such as copper, stainless steel, brass, or other metals or alloys with good thermal conductivity. The double walls define a space 142 there between through which chilled water (which may be at a temperature from about room temperature down to about 0° C., for example. Water warmer than room temperature could be used, of course, but would be less efficient in removing heat from the tube 110) or other coolant exhibiting good heat transfer characteristics is flowed. Baffles 142, or other routing configurations may be constructed in the space 142 to distribute the flow of coolant all around the circumference of the inner wall of cooling jacket 142 for more effective cooling of the tube 110. An inlet 144 and outlet 146 are provided for the inflow and outflow of water, respectively, into and out of the cooling jacket 140.

During abatement processing, as $H_2$ and $F_2$ react and heat is generated within tube 110, heat is transferred to cooling jacket 140 and particularly to the inner wall of cooling jacket 140. The heat from the cooling jacket 140 is in turn transferred to the coolant between the walls of jacket 140 and the coolant is circulated out of the jacket, thereby removing the heat it contains, to be replaced by coolant at a lower temperature. Inlet 144 and outlet 146 may be connected to a coolant source or reservoir by coolant lines 152 and 154, respectively. The reservoir may be a closed source, as shown, or an open source, such as a tap water line, for example, in which case, output line 154 would not recirculate, but would go to a drain or another storage container. A pump 156 (or a controlled valve or faucet, in the case of a pressurized water supply) is provided to drive the coolant through input line 152 and inlet 144 into the cooling jacket 140.

The pump 156, faucet, valve or other flow control mechanism may be controlled manually and set to a steady state flow rate, or an optional controller may be electrically connected to the pump, faucet, valve, etc., to set the flow rate either statically or dynamically. For dynamic control, a thermocouple 162 or other temperature sensing device may be mounted to the outlet 146 of the cooling jacket, or some other location in thermal contact with the coolant either in the cooling jacket or exiting the cooling jacket, or in the foreline 220, to provide feedback information to the controller 160. Based on a predetermined optimum temperature range, which may be about 200° C. to about 400° C., for example, the controller compares the temperature readings received from the thermocouple 162 and increases the flow rate of coolant if the temperature is at, near or above the high end of the predetermined temperature range. If the temperature reading from the thermocouple 162 is at, near or below the low end of the predetermined temperature range, the controller sends a signal to decrease the flow of coolant, and if the temperature reading is well within the range, no change is made to the flow.

Maintenance of the tube 110 and the contents therein within the predetermined temperature range using a cooling arrangement as described above will generally be adequate to also maintain the system at safe operating pressures. However, again due to the explosive nature of hydrogen, an additional layer of safety control may be built into the apparatus according to the present invention. This layer involves the inclusion of at least one safety interlock which functions to shut off the $H_2$ supply to line 120 if the pressure exceeds a predetermined safety limit. The pressure within tube 110 is initially dictated by the pressure of the effluent byproduct gases exiting the chamber 200 through foreline 220. This pressure is the same as the pressure within the chamber 200 which is controlled by a throttle valve (not shown) that controls the outflow from the chamber 200 into the foreline 220, as commonly used in the art.

The exothermic reaction of $H_2$ and $F_2$ in the tube 110 generates additional pressure, which, left unchecked could build to 20 Torr, up as high as atmospheric pressure. As a safety precaution, the hydrogen line 120 may be provided with a pressure gauge 122 (such as an MKS Baratron pressure gauge (MK Baratron® & Control Products, Andover, Mass., for example) to monitor the hydrogen pressure. Gas panel 300 may be provided with an electronic valve (ev Block) 310 which is pneumatically actuated to turn a valve in the gas panel on and off. Pressure gauge 122 is electrically connected to gas panel 300 to provide a feedback signal which corresponds to the amount of pressure read by the gauge 122. When gas panel 300 interprets a feedback signal that signifies that the pressure within line 120 has exceeded a predetermined pressure level (such as about 9 Torr, for example), the gas panel 300 sends a signal to ev Block 310 to turn off the valve in the gas panel that controls the flow of $H_2$ to line 120, thereby preventing a risk of leakage due to elevated pressures. Once the pressure has dropped below the predetermined pressure value, the gas panel 300 controls ev Block 310 to turn the gas valve on again.

A pump 170 (such as one provided by B.O.C. Edwards, of Santa Clara, Calif., for example) may be provided inline with the foreline 220 and tube 110, preferably downstream of tube 110 to drive the flow of byproducts through tube 110 and downline. A heater box 190, such as a Guardian (described above) may be provided downline for incineration of flammable and oxidizing gas byproducts. A wet (water) scrubber 180 may further be provided downline for removal of the HF byproduct resultant from processing in the abatement apparatus 100.

Figure 2A:
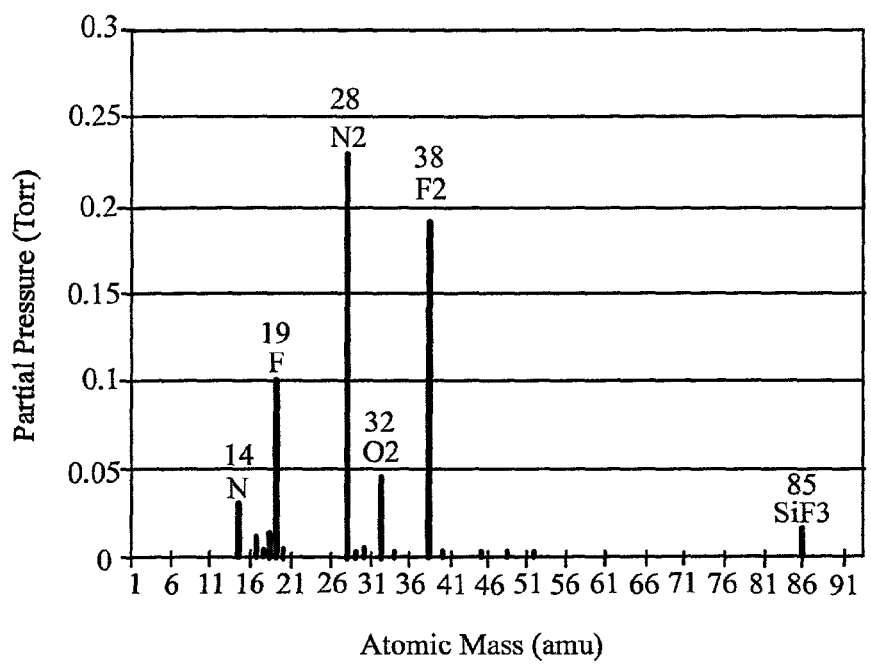
FIG. 2A is a static baseline spectrograph showing the composition of effluent gases exiting a clean CVD chamber undergoing a standard cleaning process.
Figure 2B:
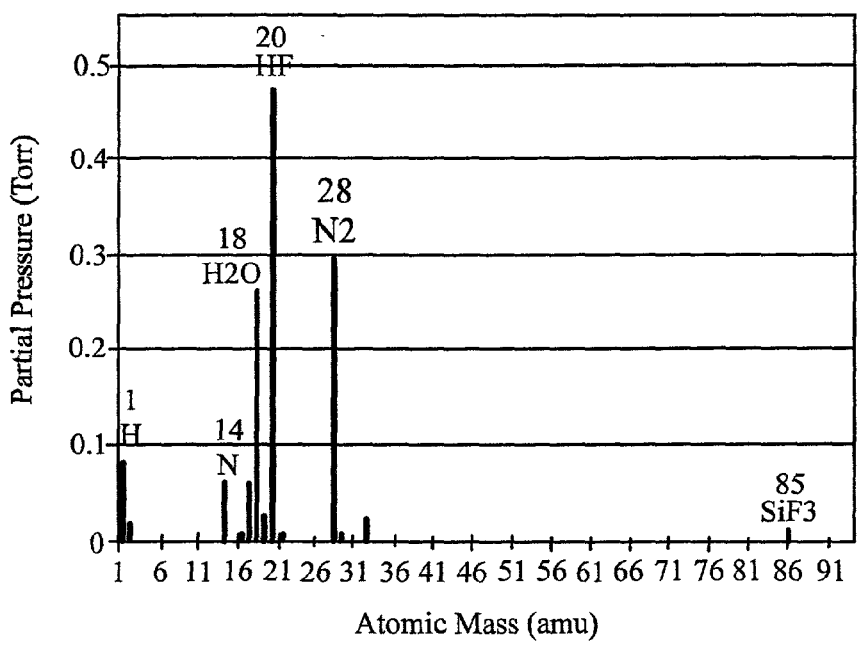
FIG. 2B is a static spectrograph showing the composition of effluent gases exiting a clean CVD chamber undergoing a cleaning process, wherein the effluent gases are treated according to the present invention.

Turning to FIGS. 2A–2B, static spectrographs are shown for a comparison of the composition of effluent gases exiting a clean CVD chamber undergoing a standard cleaning process, without abatement (i.e., baseline spectrograph of FIG. 2A) and the composition of effluent gases after $F_2$ abatement processing using the abatement apparatus 100 according to the present invention (FIG. 2B). The spectrographs were formed using an MKS UTI Qualitrace Residual Gas Analyser (available from MKS Instruments, UL Ltd., Cheshire, Wash.) capable of measuring partial pressures of elements with masses within the range of 1 to 200 atomic mass units (amu). The baseline spectrograph of FIG. 2A was made by measuring the effluent from a clean CVD chamber having no substantial film buildup, (i.e., not directly after one or more deposition processes have been conducted) using a standard microwave clean process at 2100 W of power and a flow rate of 950 sccm of $NF_3$ cleaning gas. The baseline indication of a small Si peak at 85 is likely due to buildup in other parts of the system, such as the foreline, for example as can be seen, the partial pressure of $F_2$ resulting from this cleaning process was about 0.19 Torr.

The static spectrograph of FIG. 2B shows, in contrast, that the abatement process using an $H_2$ flow rate of 1415 sccm effectively eliminates substantially all of the $F_2$ effluent. The $H_2$ flow rate of 1415 sccm was empirically determined to be the stoichiometric amount of hydrogen needed to react with all of the $F_2$ existing in the effluent. In general, the optimum ratio of hydrogen molecules to $NF_3$ molecules is the stoichiometric ratio of 3/2. Additionally, FIG. 2B shows a partial pressure of HF to be about 0.47 Torr as opposed to the negligible partial pressure of HF in FIG. 2A.

FIGS. 3A–3D are dynamic spectrographs that were formed using the same instrumentation as with the static spectrographs in FIGS. 2A–2B. The basic procedure in FIGS. 3A–3D, was to flow $NF_3$ cleaning gas into a clean CVD chamber having no film buildup, and strike a plasma therein using a standard microwave procedure with application of 2100 W of power, just as in the procedures of FIGS. 2A and 2B. The dynamic spectrographs show changes in partial pressure (in Torr) with respect to time (in seconds). The plasma was struck in the chamber after about 100 seconds had elapsed, in each of the runs represented by FIGS. 3A–3D.

Figure 3A:
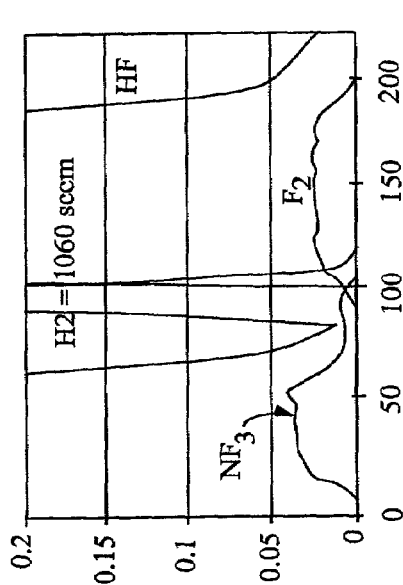
FIG. 3A is a dynamic baseline spectrograph showing a change in $F_2$ concentration over time as $NF_3$ is introduced into a clean CVD chamber according to a standard cleaning process, and reacts to form byproducts.

FIG. 3A shows the results where no $H_2$ was inputted into the abatement apparatus 100, to give a baseline reading for $F_2$. The tracing that runs from 0 to 100+ seconds indicates the $NF_3$ cleaning gas which is detected prior to striking the plasma at 100 seconds. The tracing beyond 100 seconds is the resultant $F_2$ after striking of the plasma and reaction in the chamber.

Figure 3B:
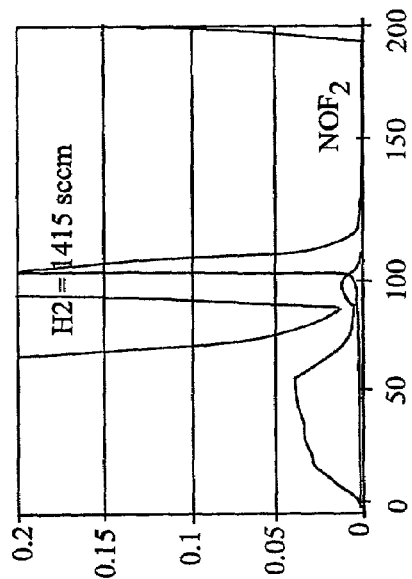
FIG. 3B is a dynamic spectrograph showing a change in $F_2$ concentration over time as the same process as in FIG. 3A is conducted, except that $H_2$ is also inputted for abatement purposes according to the present invention at a rate of about 530 sccm.
Figure 3C:
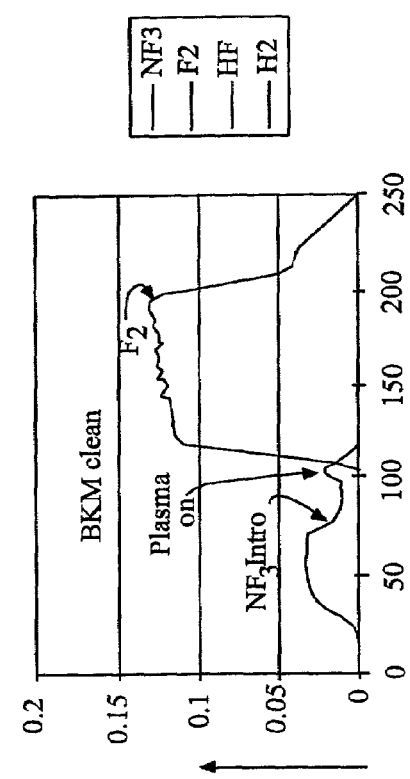
FIG. 3C is a dynamic spectrograph showing a change in $F_2$ concentration over time as the same process as in FIG. 3A is conducted, except that $H_2$ is also inputted for abatement purposes according to the present invention at a rate of about 1060 sccm.
Figure 3D:
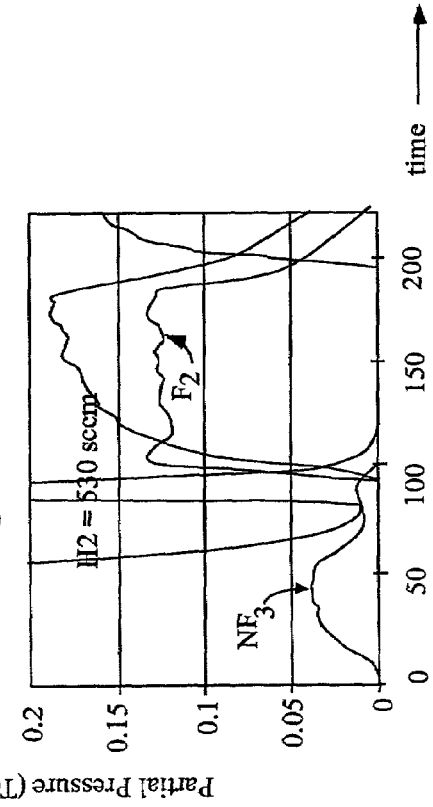
FIG. 3D is a dynamic spectrograph showing a change in $F_2$ concentration over time as the same process as in FIG. 3A is conducted, except that $H_2$ is also inputted for abatement purposes according to the present invention at a rate of about 1415 sccm.

FIG. 3B shows a run in which $H_2$ was inputted into the tube 110 at a flow rate of 530 sccm, with all other conditions remaining the same as in FIG. 3A. Some abatement of the $F_2$ partial pressure over time can be observe, after the initial peak just after the plasma was struck (i.e., at about 105 to 110 seconds). However, a large portion of the $F_2$ exited the tube 110 unabated. Tracings of $H_2$ and HF are also indicated in FIG. 3B.

The flow rate of $H_2$ was increased to 1060 sccm in FIG. 3B, with all other conditions remaining the same as in FIGS. 3A and 3B. A very significant decrease in the amount of unabated $F_2$ can be observed as a result of the doubling of the hydrogen flow rate. In FIG. 4B, no significant amount of $F_2$ registered when the flow rate of $H_2$ was increased to 1415 sccm, with all other conditions remaining the same as in FIGS. 3A–3C.

While the present invention has been described with reference to the specific embodiments thereof, it should be understood by those skilled in the art that various changes may be made and equivalents may be substituted without departing from the true spirit and scope of the invention. Although the above description is directed to specific apparatuses and process for abating $F_2$, it is to be understood that many modifications may be made to adapt a particular situation, material, composition of matter, process, process step or steps, to the objective, spirit and scope of the present invention. All such modifications are intended to be within the scope of the claims appended hereto.

That which is claimed is:

1. A method of abating $F_2$ from byproducts generated during cleaning of a processing chamber, said method comprising:
   injecting a reducing gas consisting essentially of $H_2$ or a gas having a strong H+ content that does not form a hazardous byproduct with $F_2$ directly in line with a foreline carrying the byproducts from the chamber; and
   reacting the reducing gas with the $F_2$ present in the byproducts, at a location where said injecting takes place.

2. The method of claim 1, wherein the chamber is a CVD chamber.

3. The method of claim 1, further comprising the step of controlling a temperature of the line into which the reducing gas is injected during said reacting.

4. The method of claim 3, wherein said controlling is performed to maintain the temperature within a range of about 200° C. to about 400° C.

5. The method of claim 3, wherein said controlling comprises monitoring the temperature, and flowing a coolant over the line at a rate to maintain the temperature within a predetermined temperature range.

6. The method of claim 1, further comprising the step of monitoring a pressure of a line used for injecting the reducing gas.

7. The method of claim 6, further comprising ceasing injecting $H_2$ when said monitoring determines that the pressure of the line used for injecting the reducing gas exceeds a predetermined pressure value.

8. The method of claim 7, wherein the predetermined pressure value is about 9 Torr.

9. The method of claim 1, wherein said $H_2$ is directly injected at a flow rate determined to provide a stoichiometric amount of $H_2$ to react with the amount of $F_2$ byproduct present.

10. A method of abating $F_2$ from byproducts generated during cleaning of a substrate processing chamber, said method comprising:
    injecting $H_2$ directly in line with a foreline carrying the byproducts in an effluent exhausted from the substrate processing chamber, at a flow rate that is significantly lower than a flow rate of effluent exiting the substrate processing chamber; and
    reacting the $H_2$ with the $F_2$ present in the byproducts, at a location where said injecting takes place.

11. A method of abating $F_2$ from byproducts generated during cleaning of a substrate processing chamber, said method comprising:
    injecting $H_2$ directly in line with a foreline carrying the byproducts from the chamber; and
    reacting the $H_2$ with the $F_2$ present in the byproducts, at a location downstream of the substrate processing chamber; and
    controlling a temperature of a location in which the $H_2$ and $F_2$ react by cooling the location to maintain the temperature within a range of about 200° C. to about 400° C.

12. A method of operating a substrate processing chamber, the method comprising:
    cleaning the substrate processing chamber using a technique that generates $F_2$ byproducts that are exhausted from the chamber into an exhaust foreline;
    flowing $H_2$ into the exhaust foreline using a path that bypasses the substrate processing chamber; and
    reacting the $H_2$ with the $F_2$ byproducts in the exhaust foreline to form HF byproducts while cooling a portion of the exhaust foreline in which the reacting takes place.

13. The method of claim 12 wherein the substrate processing chamber is a CVD chamber.

14. The method of claim 12 further comprising controlling a temperature of the exhaust foreline into which the $H_2$ is directly injected by flowing a coolant liquid over a surface of the foreline.

15. The method of claim 14 wherein the step of controlling a temperature is performed to maintain the temperature within a range of about 200° C. to about 400° C.

16. The method of claim 12 further comprising:
    monitoring a pressure of a $H_2$ line through which the $H_2$ flows prior to direct injection into the exhaust foreline; and
    adjusting a flow rate of the $H_2$ based on the pressure.

17. The method of claim 12 wherein the step of cleaning the substrate processing chamber flows $NF_3$ into the substrate processing chamber.

18. The method of claim 17 wherein the step of cleaning the substrate processing chamber removes silicon oxide deposits from interior surfaces of the substrate processing chamber.

19. The method of claim 11 further comprising monitoring a pressure of a line used for injecting $H_2$.

20. A method of operating a substrate processing chamber, the method comprising:
    cleaning the substrate processing chamber using a technique that generates $F_2$ byproducts in an effluent that is exhausted from the chamber into an exhaust foreline;
    flowing $H_2$ into the exhaust foreline using a path that bypasses the substrate processing chamber, wherein the $H_2$ is introduced into the exhaust foreline at a flow rate that is significantly lower than a flow rate of the effluent exhausted from the substrate processing chamber; and
    reacting the $H_2$ with the $F_2$ byproducts in the exhaust foreline to form HF byproducts.

21. A method of operating a substrate processing chamber, the method comprising:
    cleaning the substrate processing chamber using a technique that generates $F_2$ byproducts that are exhausted from the chamber into an exhaust foreline;
    flowing $H_2$ into the exhaust foreline using a path that bypasses the substrate processing chamber; and reacting the $H_2$ with the $F_2$ byproducts in the exhaust foreline without the presence of a catalyst to form HF byproducts.

* * * * *